(12) United States Patent
Song et al.

(10) Patent No.: US 7,537,878 B2
(45) Date of Patent: May 26, 2009

(54) METHOD OF FABRICATING ORGANIC LIGHT EMITTING DISPLAY

(75) Inventors: Myung-Won Song, Suwon-si (KR); Seong-Taek Lee, Suwon-si (KR); Mu-Hyun Kim, Suwon-si (KR); Byung-Doo Chin, Seongnam-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 11/020,666

(22) Filed: Dec. 27, 2004

(65) Prior Publication Data

US 2006/0040200 A1 Feb. 23, 2006

(30) Foreign Application Priority Data

Aug. 20, 2004 (KR) ........................ 10-2004-0066079

(51) Int. Cl.
*G03F 7/00* (2006.01)
(52) U.S. Cl. ........................ 430/199; 430/200; 430/203; 430/207; 430/945; 428/690
(58) Field of Classification Search ................ 430/199, 430/200, 203, 207, 945; 428/690
See application file for complete search history.

(56) References Cited

U.S. PATENT DOCUMENTS

| | | | |
|---|---|---|---|
| 5,998,085 | A | 12/1999 | Isberg et al. |
| 6,114,088 | A | 9/2000 | Wolk et al. |
| 6,214,520 | B1 | 4/2001 | Wolk et al. |
| 6,291,116 | B1 * | 9/2001 | Wolk et al. ............ 430/14 |
| 6,555,284 | B1 * | 4/2003 | Boroson et al. ............ 430/201 |
| 6,562,146 | B1 * | 5/2003 | DeYoung et al. ............ 134/30 |
| 6,566,032 | B1 * | 5/2003 | Boroson et al. ............ 430/200 |
| 6,582,875 | B1 * | 6/2003 | Kay et al. ............ 430/200 |
| 6,582,876 | B2 * | 6/2003 | Wolk et al. ............ 430/200 |
| 6,583,557 | B2 * | 6/2003 | Hashimoto et al. ............ 313/506 |
| 6,602,790 | B2 * | 8/2003 | Kian et al. ............ 438/690 |
| 6,610,455 | B1 * | 8/2003 | Burberry et al. ............ 430/200 |
| 6,682,863 | B2 * | 1/2004 | Rivers et al. ............ 430/22 |
| 6,695,030 | B1 * | 2/2004 | Phillips et al. ............ 156/540 |

(Continued)

FOREIGN PATENT DOCUMENTS

CN 1424777 6/2003

(Continued)

OTHER PUBLICATIONS

Chinese Office Action dated Mar. 7, 2008.

*Primary Examiner*—Amanda C. Walke
(74) *Attorney, Agent, or Firm*—H.C. Park & Associates, PLC (57) ABSTRACT

A method of fabricating an OLED is provided. The method includes providing a substrate, in which a pixel electrode is formed. In addition, the method includes laminating a donor substrate attached to a frame on an entire surface of the substrate, and irradiating a laser to a predetermined region of the donor substrate to form an organic layer pattern on the pixel electrode. The present invention provides a method of fabricating the OLED capable of suppressing generation of contaminants such as particles and so on, and preventing the donor substrate from sagging or bending, as well as improving transfer efficiency since the donor substrate and the substrate are readily adhered to each other to maintain vacuum state.

13 Claims, 6 Drawing Sheets

U.S. PATENT DOCUMENTS

| | | | |
|---|---|---|---|
| 6,703,180 B1 * | 3/2004 | Boroson et al. | 430/200 |
| 6,777,025 B2 * | 8/2004 | Bedzyk | 427/171 |
| 6,811,938 B2 * | 11/2004 | Tutt et al. | 430/22 |
| 6,838,836 B2 * | 1/2005 | Seo et al. | 315/169.3 |
| 6,890,627 B2 * | 5/2005 | Culver et al. | 428/195.1 |
| 6,928,746 B2 * | 8/2005 | Arena-Foster et al. | 34/351 |
| 6,949,145 B2 * | 9/2005 | Banerjee et al. | 134/1 |
| 7,056,391 B2 * | 6/2006 | Banerjee et al. | 134/26 |
| 7,075,228 B2 * | 7/2006 | Seo et al. | 313/504 |
| 2004/0123940 A1 | 7/2004 | Bedzyk | |

FOREIGN PATENT DOCUMENTS

| | | |
|---|---|---|
| JP | 2001-313164 | 11/2001 |
| JP | 2003-077658 | 3/2003 |
| JP | 2003-243163 | 8/2003 |
| JP | 2003-308974 | 10/2003 |
| JP | 2003-332062 | 11/2003 |
| JP | 2004-079540 | 3/2004 |
| JP | 2004-527075 | 9/2004 |
| JP | 2006-511922 | 4/2006 |
| KR | 10 1998 0051844 | 11/1998 |
| KR | 10-2004-0010371 | 1/2004 |

* cited by examiner

METHOD OF FABRICATING ORGANIC LIGHT EMITTING DISPLAY

CROSS-REFERENCE TO RELATED APPLICATION

This application claims the benefit of Korean Patent Application No. 2004-66079, filed Aug. 20, 2004, the disclosure of which is hereby incorporated herein by reference in its entirety.

BACKGROUND OF THE INVENTION

1. Field of the Invention

The present invention relates to a method of fabricating an organic light emitting display and, more particularly, to a method of fabricating an organic light emitting display including forming a donor substrate attached to a frame to transfer the donor substrate, when an organic layer pattern is formed by a laser induced thermal imaging (LITI) method.

2. Description of the Related Art

Generally, an organic light emitting display (hereinafter, referred to as OLED) as a flat panel display includes anode and cathode electrodes, and organic layers interposed between the anode and cathode electrodes. The organic layers include at least an emission layer, and may further include a hole injection layer, a hole transport layer, an electron transport layer, and an electron injection layer, in addition to the emission layer. This OLED is classified into a polymer OLED and a low molecular OLED depending on a material for forming the organic layer, especially, the emission layer.

In the OLED, in order to realize full color displays, the emission layer should be patterned. The emission layer can be patterned by a method using a shadow mask in the case of the low molecular OLED, and by an inkjet printing method or an LITI (laser induced thermal imaging) method in the case of the polymer OLED. Among them, the LITI method may finely pattern the organic layer and has an advantage of realizing high-resolution and large-sized displays, and may employ a dry etching process unlike the inkjet printing method employing a wet etching process.

The method of forming the organic layer pattern using the LITI method requires at least a light source, an OLED substrate and a donor substrate. Patterning the organic layer on the substrate is performed as light emitted from the light source is absorbed into a light-heat conversion layer of the donor substrate to be converted to heat energy and a material for forming a transfer layer is transferred on the substrate by the heat energy. These are disclosed in Korean Patent Application No. 1998-51844 and U.S. Pat. Nos. 5,998,085, 6,214,520 and 6,114,088.

At this time, since a process of laminating the donor substrate on the substrate is required, the donor substrate was deposited on the substrate using a lamination roll in a conventional art. That is, after winding the donor substrate, at which the transfer layer was formed, on the lamination roll, the donor substrate is cut and moved, and then the donor substrate wound on the lamination roll is unwound to be deposited on the substrate. The lamination method is very simple, but there is a problem of deteriorating the characteristics of the OLED. That is, there may be generated crack or contaminants such as particles generated while the flexible donor substrate is wound on the lamination roll. In particular, since a process of forming the transfer layer in the donor substrate and a lamination process for the LITI are separately performed, there is a problem of deteriorating the characteristics of the OLED due to contaminants such as particles and so on, which may be generated between both processes.

SUMMARY OF THE INVENTION

The present invention, therefore, solves aforementioned problems associated with conventional devices by providing a method of fabricating an OLED capable of suppressing generation of contaminants such as particles and so on, which may be generated between a process of forming a transfer layer in a donor substrate and a process of laminating the donor substrate on the substrate, as well as improving transfer efficiency.

In an exemplary embodiment of the present invention, a method of fabricating an OLED is provided. The method includes providing a substrate, in which a pixel electrode is formed. In addition, the method includes laminating a donor substrate attached to a frame on an entire surface of the substrate, and irradiating a laser to a predetermined region of the donor substrate to form an organic layer pattern on the pixel electrode. Preferably, a transfer layer in the donor substrate is formed after the donor substrate is attached to the frame. After forming the donor substrate attached to the frame, the transfer layer in the donor substrate is formed and the donor substrate is laminated on the substrate, thereby suppressing generation of contaminants such as particles and so on, and preventing the donor substrate from sagging or bending, as well as improving transfer efficiency.

Forming the donor substrate attached to the frame may include unwinding the donor substrate, cutting the donor substrate, and attaching the cut donor substrate to the frame. Cutting the donor substrate may include cutting the donor substrate in a running direction of the donor substrate, and cutting the donor substrate in a perpendicular direction to the running direction of the donor substrate. After cutting the donor substrate in the running direction of the donor substrate, the progress may further include winding the remained donor substrate, which is cut and not used as the donor substrate.

Before attaching the donor substrate to the frame, the method may further include cleaning the donor substrate, and the cleaning may be performed by a dry or wet cleaning method.

After attaching the donor substrate to the frame, the method may further include cleaning the donor substrate, and the cleaning is preferably performed by the dry cleaning method.

Before or after attaching the donor substrate to the frame, the donor substrate may be surface treated, and the surface treatment may be performed using plasma.

Before or after attaching the donor substrate to the frame, static electricity of the donor substrate may be removed.

Forming the organic layer pattern on the pixel electrode may be performed in an $N_2$ or vacuum atmosphere.

The formed organic layer pattern may be made of a single layer or at least two multi layers selected from a group consisting of an emission layer, a hole injection layer, a hole transport layer, an electron transport layer, and an electron injection layer.

BRIEF DESCRIPTION OF THE DRAWINGS

The above and other features of the present invention will be described in reference to certain exemplary embodiments thereof with reference to the attached drawings in which.

DETAILED DESCRIPTION OF THE INVENTION

Hereinafter, an exemplary embodiment of the present invention will be described in conjunction with the accompanying drawings. However, the present invention is not limited to the embodiment described herein, and may be modified as another configurations. Like reference numerals designate like elements.

Figure 1:
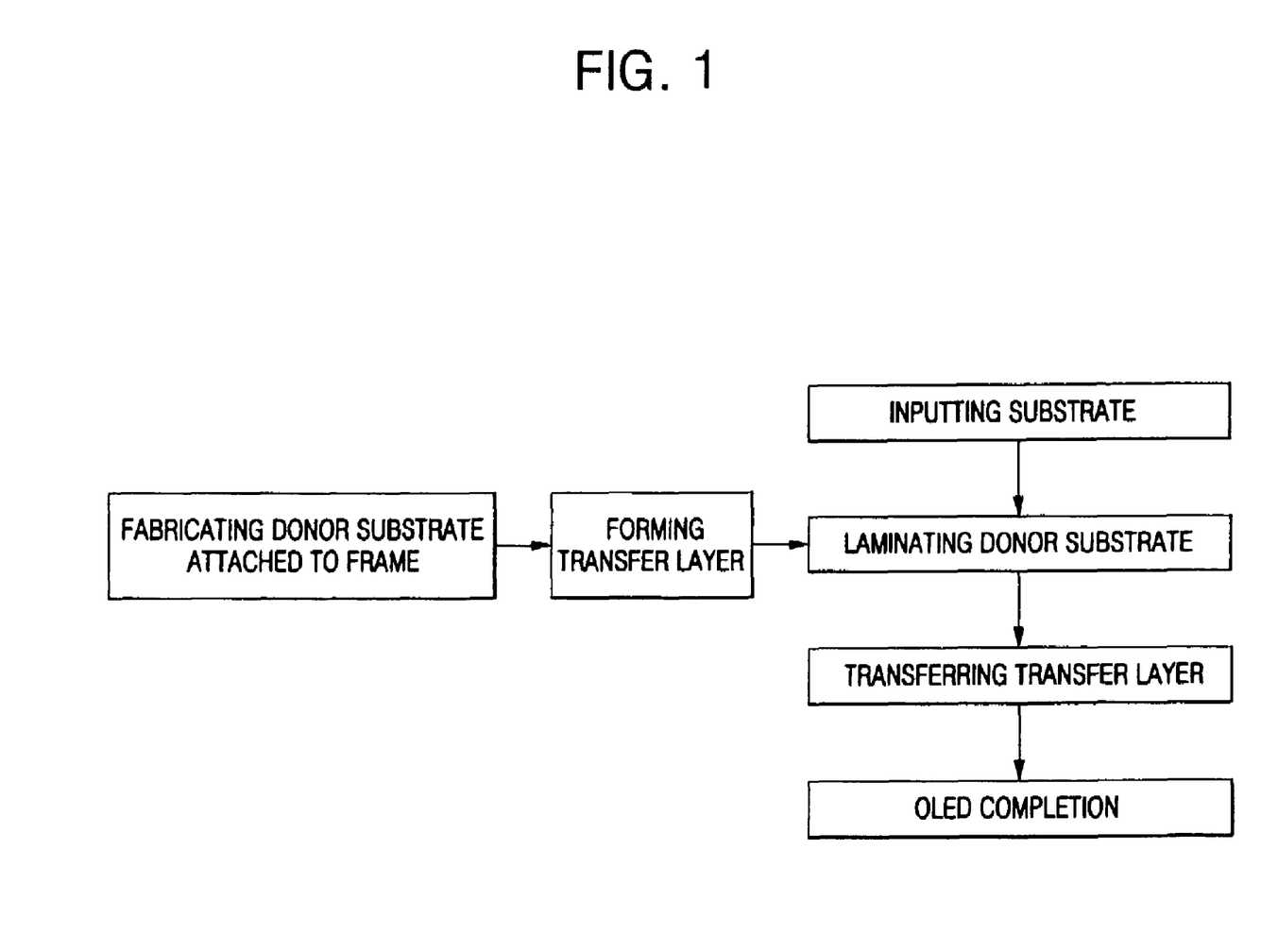
FIG. 1 is a flow chart illustrating a method of fabricating an OLED in accordance with an embodiment of the present invention.

FIG. 1 is a flow chart illustrating a method of fabricating an OLED in accordance with an embodiment of the present invention.

Referring to FIG. 1, after a process of inputting a substrate, at which a predetermined element is formed, a process of laminating a donor substrate on the substrate is performed. At this time, generally, a TFT, a planarization layer on the TFT, and a pixel electrode on the planarization layer are formed on the substrate.

The donor substrate is laminated on the substrate having the pixel electrode. In a conventional art, while a sheet-shaped donor substrate is laminated on the substrate using a lamination roll, in the present invention, the sheet-shaped donor substrate is attached to a frame to be laminated on the substrate having the pixel electrode.

After a process of fabricating the donor substrate attached to the frame, a process of forming a transfer layer in the donor substrate is performed.

That is, the present invention is characterized in that after attaching the sheet-shaped donor substrate to the frame, the transfer layer is formed, and the donor substrate is laminated on the substrate.

After laminating the donor substrate attached to the frame on the substrate having the pixel electrode, a transfer process of irradiating a laser to form an organic layer pattern on the pixel electrode is performed.

After the transfer process, a cathode electrode is formed on the organic layer pattern to complete the OLED.

A method of fabricating the OLED will be described in more detail with reference to FIGS. 3A to 3H.

Figure 2:
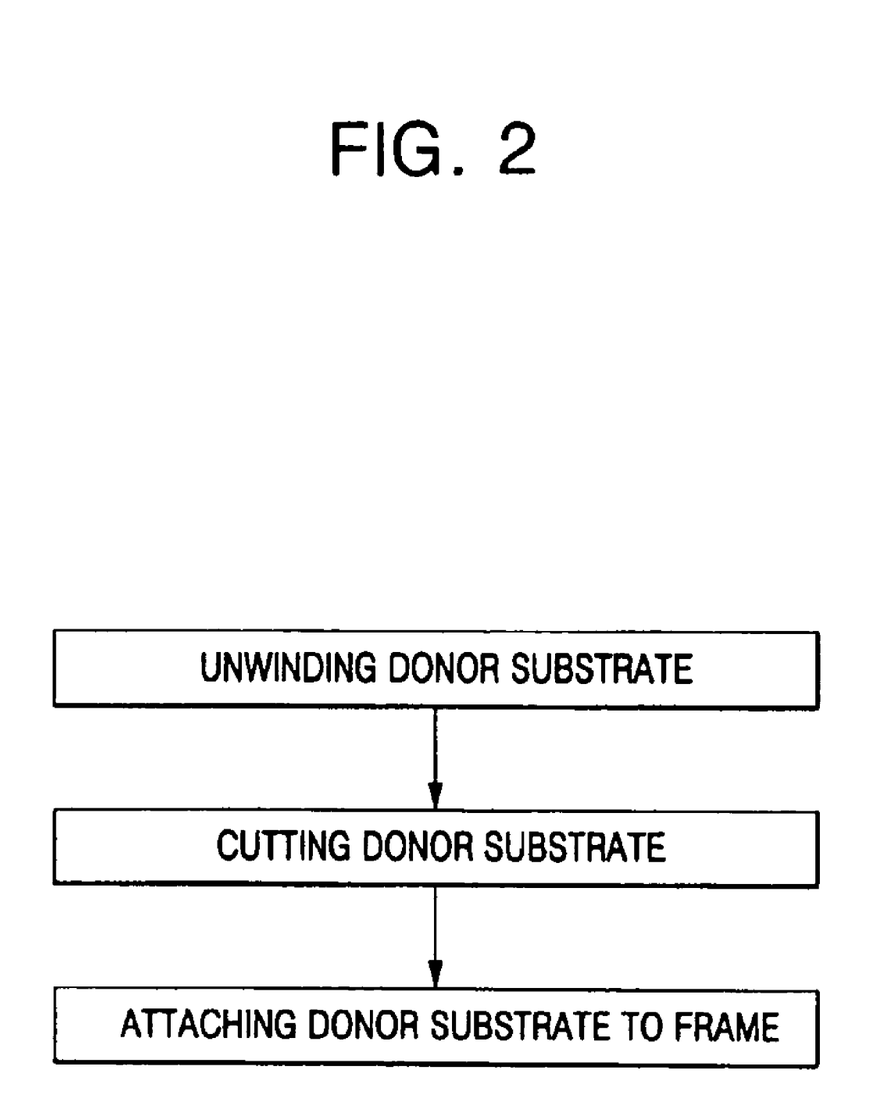
FIG. 2 is a flow chart illustrating a method of fabricating a donor substrate attached to a frame in accordance with an embodiment of the present invention.

FIG. 2 is a flow chart illustrating a method of fabricating a donor substrate attached to a frame in accordance with an embodiment of the present invention.

Referring to FIG. 2, after a process of unwinding a roll-shaped donor substrate, a process of cutting the donor substrate is performed. The donor substrate cutting process means a process of cutting a roll-shaped donor substrate into a sheet-shaped donor substrate. The method of cutting the donor substrate may employ various methods. The present invention illustrates a method, as an example, including cutting the donor substrate in the running direction of the donor substrate, and cutting the donor substrate in a perpendicular direction to the running direction of the donor substrate (see FIGS. 3B and 3C).

In addition, the donor substrate may be used by cutting at one time a size equal to the size of the frame, which is to be described later.

After the process of cutting the donor substrate, a process of attaching the donor substrate to the frame is performed.

A method of fabricating the donor substrate will be described in more detail with reference to FIGS. 3A to 3H.

FIGS. 3A to 3H are process views illustrating a method of fabricating an OLED in accordance with an embodiment of the present invention, and FIGS. 3A to 3E of which are process views illustrating a method of fabricating a donor substrate attached to a frame.

Figure 3A:
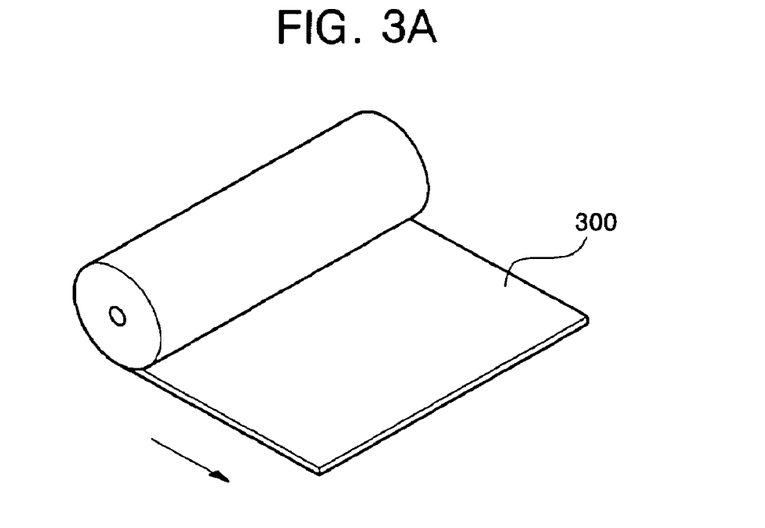
FIGS. 3A to 3H are process views illustrating a method of fabricating an OLED in accordance with an embodiment of the present invention.

Referring to FIG. 3A, a roll-shaped donor substrate 300 is unwound. The roll-shaped donor substrate is not provided with a transfer layer.

Figure 3B:
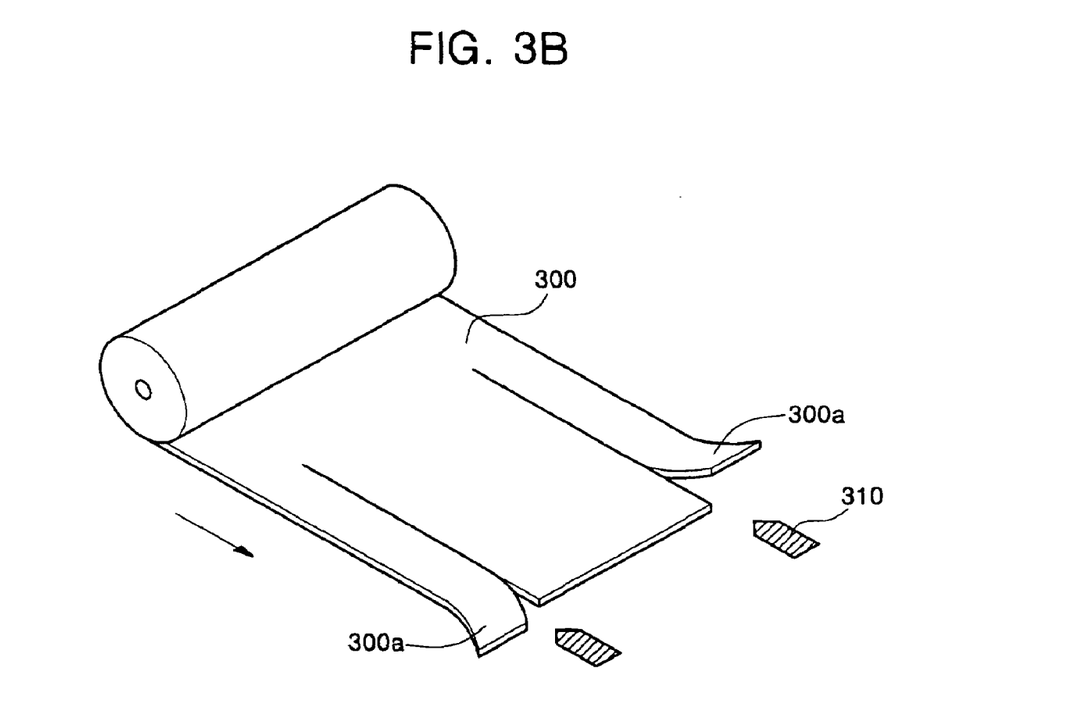

Referring to FIG. 3B, the appropriately wound roll-shaped donor substrate 300 is cut in the running direction of the roll-shaped donor substrate using a cutter 310. At this time, the method may further include winding the remained donor substrate 300a by additionally installing an apparatus for winding the remained donor substrate 300, which is not used as the donor substrate.

Figure 3C:
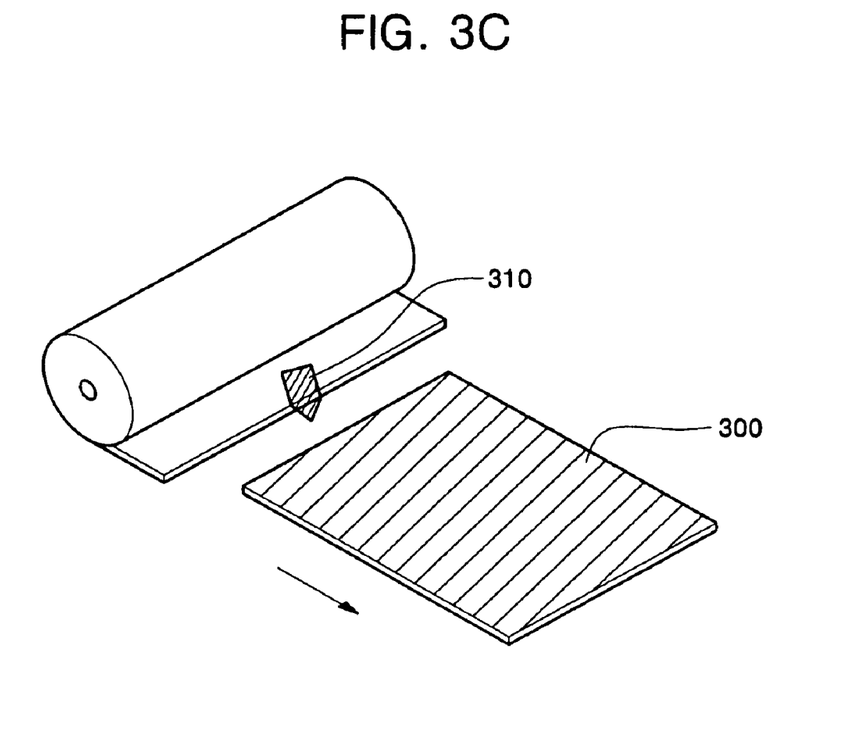

Referring to FIG. 3C, the donor substrate 300 cut in the running direction of the roll-shaped donor substrate is cut in a perpendicular direction to the running direction of the roll-shaped donor substrate using the cutter 310. That is, the roll-shaped donor substrate 300 is cut into a sheet-shaped donor substrate 300.

Since the cut donor substrate 300 is laminated on the substrate having a pixel electrode which will be described later, the donor substrate is preferably cut to an appropriate size for covering all pixel electrodes, at which an organic layer is to be formed.

At this time, before attaching the cut donor substrate 300 to the frame 330, the method may further include cleaning the donor substrate 300.

Since contaminants such as particles and so on may be generated on a surface of the donor substrate 300 while unwinding the roll-shaped donor substrate 300 and cutting the donor substrate, a cleaning process for removing the contaminants may be performed.

The cleaning process may be performed by a dry or wet cleaning method.

The dry cleaning method means a method of cleaning in a vapor or gas state without using a harmful chemical solution, and there are currently using dry cleaning methods such as a vapor cleaning method, a cleaning method using UV, a plasma cleaning method, a sputter cleaning method, and so forth.

The wet cleaning method means a method of cleaning using a chemical solution, and there are currently using wet cleaning methods such as an RCA cleaning method, a piranha cleaning method, a DHF cleaning method, an ozone cleaning method, and so forth.

Figure 3D:
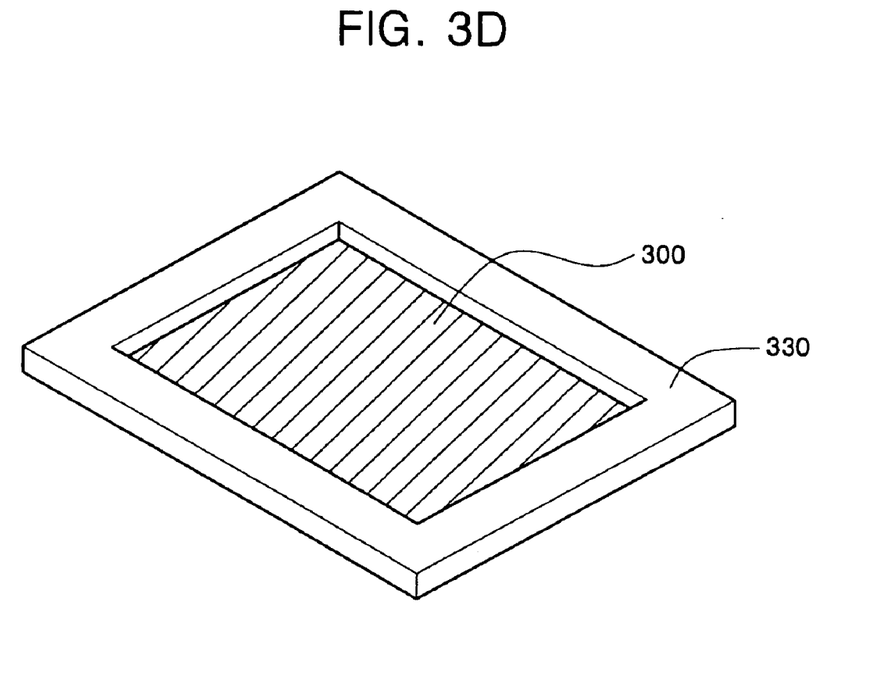
Figure 3E:
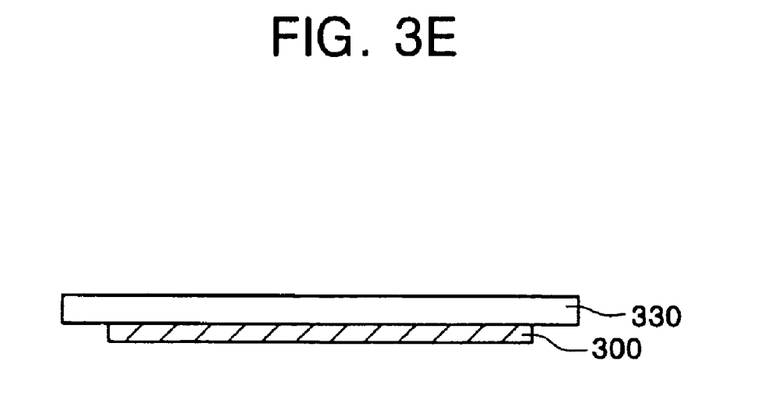

FIGS. 3D and 3E are a perspective view and front views illustrating the donor substrate attached to the frame.

Referring to FIGS. 3D and 3E, the sheet-shaped donor substrate 300 is attached to the frame 330. The present invention uses the cut donor substrate 300 attached to the frame 330 in order to suppress generation of the particles and improve transfer efficiency. Various-shaped frames may be used, and it will be appreciated that the embodiment uses the frame 330 having a rectangular-shaped empty space for attaching the cut donor substrate 300. Since a transfer process for irradiating the laser is performed through the empty space, an appropriate size of empty space is preferably formed in the frame such that the laser is irradiated to all pixel electrodes, at which an organic layer pattern is to be formed.

In addition, it will be appreciated that the sheet-shaped donor substrate 300 is attached to one surface of the frame 330.

After attaching the sheet-shaped donor substrate 300 to the frame 330, the method may further include cleaning the donor substrate 300.

Since a process of forming the transfer layer is performed after attaching the cut donor substrate 300 to the frame 330, contaminants generated on the surface of the donor substrate 300 are preferably removed. That is, a cleaning process may be performed in order to remove the contaminants such as particles and so on, which are to be generated while attaching the cut donor substrate 300 to the frame 330.

As described above, the cleaning process may perform first and second cleaning processes in addition to before and after attaching the donor substrate to the frame, or may perform one cleaning process in addition to before or after attaching the donor substrate to the frame.

Preferably, the cleaning process is performed using a dry cleaning method. This is because the donor substrate 300 attached to the frame 330 may be degenerated when the wet cleaning process is performed after the cut donor substrate 300 is attached to the frame 330.

In addition, the donor substrate 300 may be surface treated before or after attaching the cut donor substrate 300 to the frame 330. The surface treatment may be performed using plasma. The contaminants such as particles and so on generated on the surface of the donor substrate 300 may be removed through the surface treatment of the donor substrate 300, and the adhesive force is strengthened to readily form the transfer layer in the process of forming the transfer layer which will be described later In addition, static electricity may be generated on the donor substrate 300 during a process of cutting the donor substrate 300 or other processes, and an apparatus for removing the static electricity may be additionally installed to remove the static electricity before or after attaching the donor substrate 300 to the frame 330. Since the contaminants may be adhered to the donor substrate 300 when the static electricity is generated on the donor substrate 300, and deposition of transfer material may be blocked during a process of forming a transfer layer, the static electricity, which may be generated on the donor substrate 300, is preferably removed.

Figure 3F:
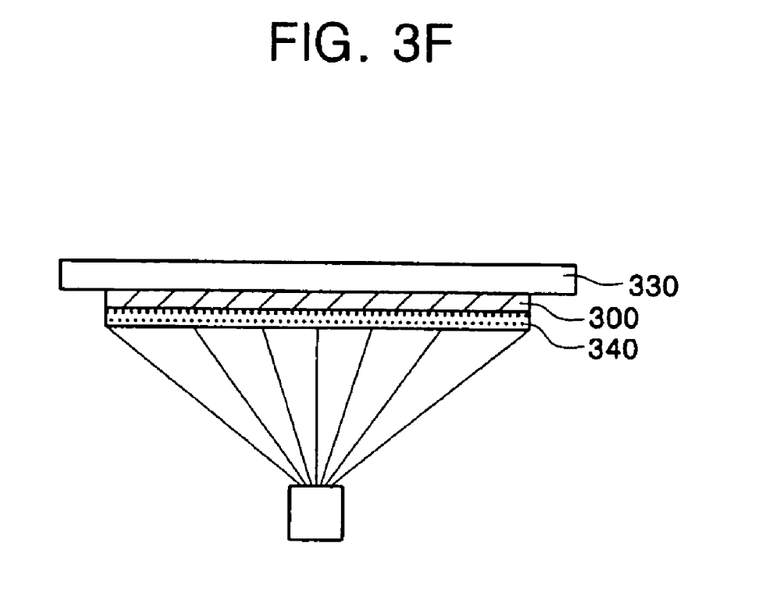

Referring to FIG. 3F, a transfer layer 340 is formed on the donor substrate 300 attached to the frame 330. The transfer layer 340 may be formed by a general coating method such as an extrusion coating method, a spin coating method, a knife coating method, a vacuum deposition method, a CVD method, and so on.

While the conventional roll-shaped donor substrate has the transfer layer, which is already formed on the donor substrate so that there are generated much more cracks and particles, the present invention is capable of suppressing generation of the cracks and particles by forming the transfer layer 340 after attaching the cut donor substrate 300 to the frame 330 as described above. In addition, it is possible to prevent the donor substrate 300 from sagging or bending.

Table 1 is a comparative table of the number of particles generated on the donor substrate, at which the transfer layer is formed by the conventional process and the number of particles generated on the donor substrate, at which the transfer layer is formed by the process of the present invention.

TABLE 1

| Process | Particles | | | |
| --- | --- | --- | --- | --- |
| | S particles | M particles | L particles | Total |
| Conventional process | 2510 | 651 | 951 | 4112 |
| Process of the present invention | 935 | 217 | 441 | 1593 |
| Difference | 1575 | 434 | 510 | 2519 |

Referring to Table 1, the number of particles generated on the donor substrate through the conventional process is 2510 S particles (small size, 1~3 μm), 651 M particles (medium size, 3~5 μm), and 951 L particles (large size, not less than 5 μm), totally 4112 particles.

Meanwhile, the number of particles generated on the donor substrate through the process of the present invention is 935 S particles, 217 M particles, and 441 L particles, totally 1593 particles. That is, it will be appreciated that the number of particles generated from the present invention process is less by 1575 S particles, 434 M particles, and 510 L particles, totally 2519 particles in comparison with the conventional process.

Figure 3G:
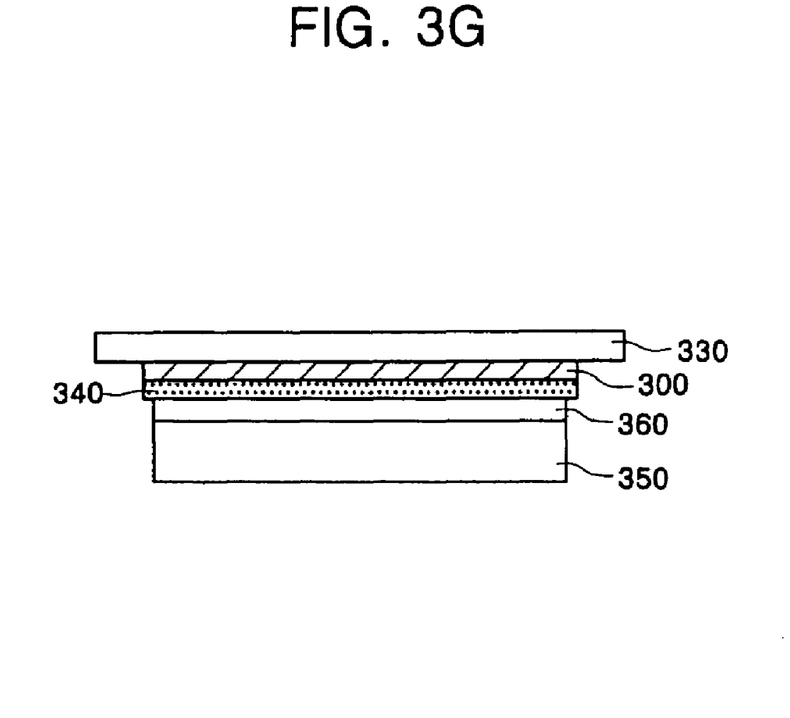

Referring to FIG. 3G, the donor substrate 300 attached to the frame 330, at which the transfer layer 340 was formed, is laminated on the substrate 350, at which the pixel electrode 360 was formed.

As described above, since the donor substrate 300 of the present invention is attached to the frame 330 to be laminated, the donor substrate 300 may be readily adhered to the substrate 350 having the pixel electrode 360 and maintain a vacuum state, thereby improving transfer efficiency.

Figure 3H:
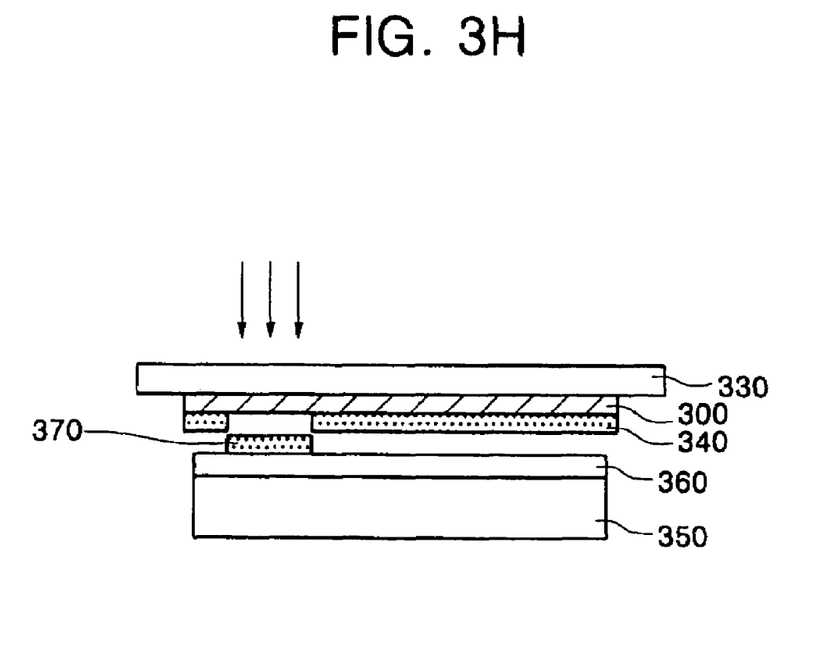

Referring to FIG. 3H, the laser is irradiated on the donor substrate 300 having the transfer layer 340 to form an organic layer pattern 370 on the pixel electrode 360.

Forming the organic layer pattern 370 may be performed in an $N_2$ atmosphere. Since the organic layer pattern 370 may be oxidized due to oxygen existing in the air, the transfer process is preferably performed in the $N_2$ atmosphere without oxygen. In addition, the transfer process may be performed in a vacuum atmosphere in order to suppress generation of bubbles between the donor substrate and the substrate during the lamination process.

The organic layer pattern formed in the transfer process may be made of a single layer or at least two multi layers selected from a group consisting of an emission layer, a hole injection layer, a hole transport layer, an electron transport layer and an electron injection layer.

As can be seen from the foregoing, the present invention provides a method of fabricating an OLED capable of suppressing generation of contaminants such as particles and so on, preventing the donor substrate from sagging or bending, and improving transfer efficiency since the donor substrate and the substrate are readily adhered to each other to maintain vacuum state, by forming the transfer layer in the donor substrate and laminating the donor substrate on the substrate after forming the donor substrate attached to the frame in forming the organic layer pattern using the LITI method.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating an organic light emitting display (OLED), comprising:
   providing a substrate having a pixel electrode;
   forming a donor substrate attached to a frame, comprising:
      unwinding the donor substrate;
      cutting the donor substrate;
      cleaning the donor substrate; and
      attaching the cut donor substrate to the frame;
   laminating the donor substrate attached to the frame on an entire surface of the substrate; and irradiating a laser to a predetermined region of the donor substrate to form an organic layer pattern on the pixel electrode,
wherein cleaning the donor substrate comprises cleaning the cut donor substrate before attaching the cut donor substrate to the frame.

2. The method according to claim 1, wherein a transfer layer in the donor substrate is formed after the donor substrate is attached to the frame.

3. The method according to claim 1, wherein the cleaning is performed by any one of a dry cleaning method and a wet cleaning method.

4. The method according to claim 1, further comprising cleaning the donor substrate after attaching the donor substrate to the frame.

5. The method according to claim 4, wherein the cleaning is performed by a dry cleaning method.

6. The method according to claim 1, wherein before or after attaching the donor substrate to the frame, the donor substrate is surface treated.

7. The method according to claim 6, wherein the surface treatment is performed using plasma.

8. The method according to claim 1, wherein before or after attaching the donor substrate to the frame, static electricity of the donor substrate is removed.

9. The method according to claim 1, wherein cutting the donor substrate comprises:
cutting the donor substrate in a running direction of the donor substrate; and
cutting the donor substrate in a perpendicular direction to the running direction of the donor substrate.

10. The method according to claim 9, further comprising winding the remained donor substrate, which is cut and not used as the donor substrate after cutting the donor substrate in the running direction of the donor substrate.

11. The method according to claim 1, wherein forming the organic layer pattern on the pixel electrode is performed in an N2 atmosphere.

12. The method according to claim 1, wherein forming the organic layer pattern on the pixel electrode is performed in a vacuum atmosphere.

13. The method according to claim 1, wherein the organic layer pattern is made of a single layer or at least two multi layers selected from a group consisting of an emission layer, a hole injection layer, a hole transport layer, an electron transport layer, and an electron injection layer.

* * * * *